United States Patent
Yang et al.

(10) Patent No.: US 7,572,682 B2
(45) Date of Patent: Aug. 11, 2009

(54) SEMICONDUCTOR STRUCTURE FOR FUSE AND ANTI-FUSE APPLICATIONS

(75) Inventors: Chih-Chao Yang, Glenmont, NY (US); Daniel C. Edelstein, White Plains, NY (US); Jack A. Mandelman, Flat Rock, NC (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/755,995

(22) Filed: May 31, 2007

(65) Prior Publication Data

US 2008/0296728 A1    Dec. 4, 2008

(51) Int. Cl.
 *H01L 21/82* (2006.01)
(52) U.S. Cl. .................. 438/131; 438/130; 438/600; 438/637; 438/638; 257/529; 257/530
(58) Field of Classification Search .................. 438/130, 438/131, 600, 637, 638; 257/529, 530
See application file for complete search history.

(56) References Cited

U.S. PATENT DOCUMENTS

| | | | |
|---|---|---|---|
| 5,200,652 A | 4/1993 | Lee | |
| 5,434,432 A | 7/1995 | Spratt et al. | |
| 5,789,795 A | 8/1998 | Sanchez et al. | |
| 5,793,094 A | 8/1998 | Sanchez et al. | |
| 5,808,351 A | 9/1998 | Nathan et al. | |
| 5,903,041 A | 5/1999 | La Fleur et al. | |
| 6,251,710 B1 | 6/2001 | Radens et al. | |
| 6,380,003 B1 | 4/2002 | Jahnes et al. | |
| 6,509,624 B1 | 1/2003 | Radens et al. | |
| 6,555,458 B1 | 4/2003 | Yu | |
| 6,621,324 B2 | 9/2003 | Fifield et al. | |
| 6,653,710 B2 | 11/2003 | Adkisson et al. | |
| 6,680,520 B2 | 1/2004 | Voldman et al. | |
| 6,683,365 B1 | 1/2004 | Trivedi | |
| 6,888,215 B2 | 5/2005 | Radens et al. | |
| 2007/0040276 A1 | 2/2007 | Yang et al. | |
| 2008/0157269 A1* | 7/2008 | Wong et al. | 257/529 |

* cited by examiner

*Primary Examiner*—M. Wilczewski
*Assistant Examiner*—Telly D Green
(74) *Attorney, Agent, or Firm*—Scully, Scott, Murphy & Presser, P.C.; Lisa U. Jaklitsch, Esq.

(57) ABSTRACT

A fuse/anti-fuse structure is provided in which programming of the anti-fuse is caused by an electromigration induced hillock that is formed adjacent to the fuse element. The hillock ruptures a thin diffusion barrier located on the sidewalls of the fuse element and the conductive material within the fuse element diffuses into the adjacent dielectric material. The fuse element includes a conductive material located within a line opening which includes a first diffusion barrier having a first thickness located on sidewalls and a bottom wall of the line opening. The anti-fuse element includes the conductive material located within a combined via and line opening which includes the first diffusion barrier located on sidewalls and a bottom wall of the combined via and line opening and a second diffusion barrier having a second thickness that is greater than the first thickness located on the first diffusion barrier.

1 Claim, 8 Drawing Sheets

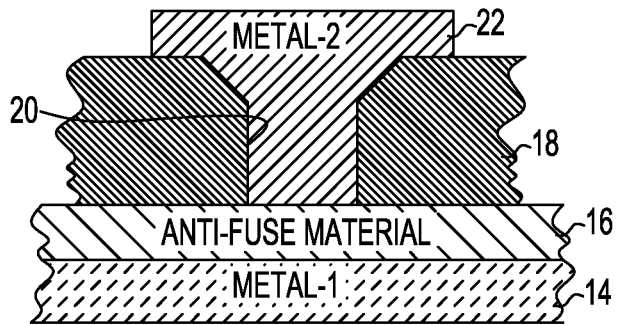
FIG. 1
(PRIOR ART)
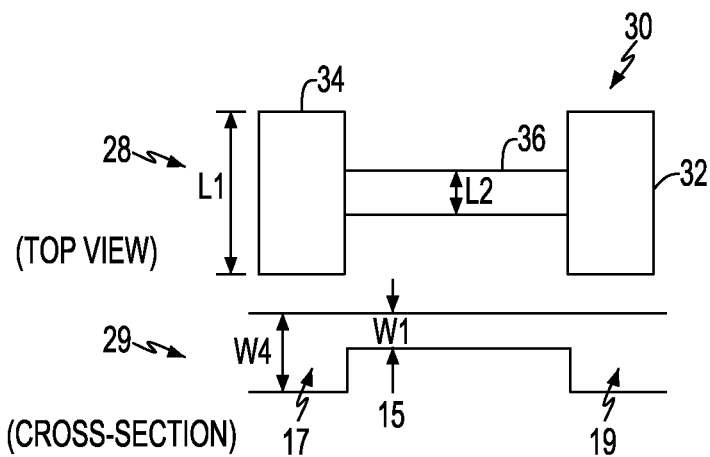
FIG. 2
(PRIOR ART)
FIG. 3A
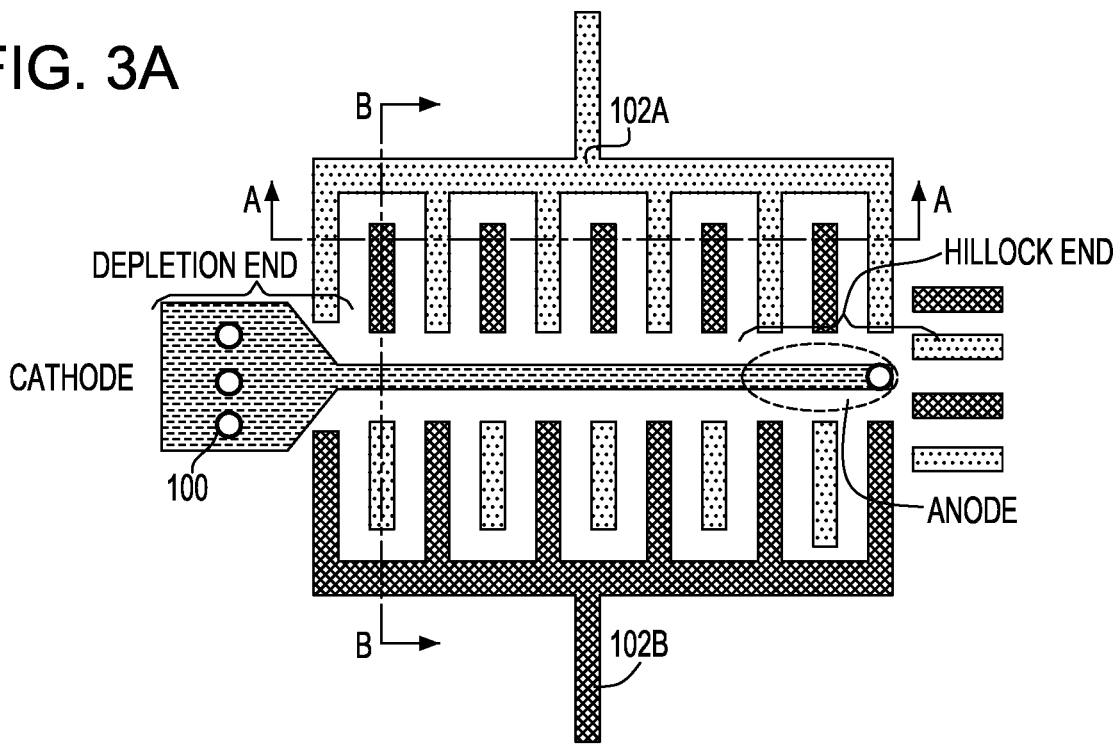

SEMICONDUCTOR STRUCTURE FOR FUSE AND ANTI-FUSE APPLICATIONS

FIELD OF THE INVENTION

The present invention relates to a semiconductor structure and a method of fabricating the same. More particularly, the present invention relates to a semiconductor structure which includes fuse and anti-fuse structures embedded within a dielectric material of an interconnect structure. The present invention also relates to a method of fabricating such a semiconductor structure.

BACKGROUND OF THE INVENTION

Anti-fuses and fuses are commonly used in the semiconductor industry for one-time programming purposes. Typically, fuses and anti-fuses are used to repair dynamic random access memory (DRAM) arrays by swapping defective cells with redundant cells. Fuses and anti-fuses can also be used in product configuration, for updating and repairing. Anti-fuse structures include a material that initially has a very high resistance, but after programming by electrical or optical means, the high resistance material is converted to a lower resistance state. Fuse structures that are blown open by electrical or optical means are used to electrically open circuits.

FIG. 1 schematically illustrates a cross section of a prior art anti-fuse structure, which includes a metal-1 layer 14, an anti-fuse layer 16, and an interconnect layer 22 embedded in a dielectric layer 18. Reference numeral 20 denotes a via that is present within the dielectric layer 18. During programming, an appropriate voltage between the metal-1 layer 14 and the interconnect layer 22 is applied and creates a conductive path, i.e., resistance of the anti-fuse structure is lowered after programming. The main drawback of such prior art anti-fuses is that they require voltages in excess of the on-chip power supply voltage to break down the insulating region between two conductors. As operating voltages continue to be scaled down, achieving and controlling sufficient anti-fuse programming voltage is increasingly difficult. Charge pumps are needed to boost the supply voltage to high enough levels to program the anti-fuse, and higher than normal voltage logic circuitry is needed to steer the programming to the desired anti-fuse. However, as both operating voltages and feature sizes continue to be aggressively scaled, the capability of on-chip devices to handle such high voltages without incurring reliability problems is diminished.

Prior art solutions to the anti-fuse programming problem entail the inclusion of special high voltage capable devices on the chip, as well as complex circuits to handle the generation and steering of such voltages. The bottom line is that, as semiconductor technology continues to be scaled down use of prior art anti-fuse technology is increasingly costly and has become an unattractive option.

Electrically blowable fuses, on the other hand, take advantage of the electromigration (EM) effect to open an electrical connection. A two-dimensional dog-bone shape fuse element of the prior art, having a small cross-sectional area between large cathode and anode pads, is shown in FIG. 2. Specifically, FIG. 2 illustrates a top view 28 and a cross sectional view 29 of a fuse structure 30. Fuse structure 30 can form an electrical metal fuse utilized in semiconductor integrated circuit devices. In FIG. 2, a first length L1 of metal structure 34 (i.e., which may be configured from copper) is illustrated. Additionally, a second length L2 of metal structure 36 is also depicted. Metal structure 32 is analogous to metal structure 34 and possesses the same length, L1. Metal structure 36 generally comprises a fuse region formed from a thin metal. At least two different dimensions of single metal lines may be configured to form fuse structure 30, thereby generating increases in current density gradients and thermal gradients thereof. Such dimensional difference is particularly illustrated in cross sectional view 29, in which a height W1 illustrated and a height W4 is also depicted. Height W1 comprises a height that is thinner than height W4. Reference numerals 17, 15 and 19 are Cu regions.

During programming of such a structure, conductive material atoms are moved and leave voids at the center fuse element due to high current density, and eventually create an electrically open circuit. It is also known that electromigration causes the "migrated" conductive material atoms to pile-up and form hillocks at the anode (most positive) end of the fuse element. Hillock formation causes electrical shorts between adjacent interconnects and is an undesirable effect that hasn't been exploited for any useful purpose in the prior art.

Both fuse and anti-fuse elements are essential for advanced DRAM applications, and it is very advantageous to integrate the two elements into a single structure that operates at normal on-chip or readily available voltages. Also, processing for integrating the anti-fuse structures mentioned in the prior art requires novel material for the anti-fuse layer, which increases overall fabrication costs. Furthermore, processing of such novel material requires special consideration to control the thickness of the anti-fuse layer, since the programming voltage for creating the electrical path is a function of this thickness; the anti-fuse material can be damaged by a dielectric over-etch or under-etch, which could lead to programming failure (i.e., the electrical path is not properly formed when an appropriate voltage is applied). Most existing anti-fuse structures have a layer of anti-fuse material sandwiched in between two "disconnected" conductive materials.

There are numerous embodiments of anti-fuses in the prior art, but most require programming voltages higher than the chip supply voltage (Vdd). Thus, there is a need for anti-fuses that can be programmed with readily available on-chip voltages. Most prior art anti-fuses are formed in BEOL metallurgy. However, all require either an anti-fuse material which departs from materials readily available in the standard process, or require special processing considerations, such as extremely tight thickness control of the anti-fuse material. Therefore, there is a need for anti-fuses that can inexpensively be integrated into standard semiconductor processes.

For example, U.S. Pat. No. 6,380,003 to Jahnes et al. discloses the formation of an anti-fuse in BEOL wiring, but requires a special anti-fuse material which departs from standard processing. U.S. Pat. No. 6,251,710 to Radens et al. also requires a special anti-fuse material in BEOL (back-end-of-the-line). U.S. Pat. No. 6,888,215 to Radens et al. is another example of a prior art BEOL anti-fuse requiring a special anti-fuse material.

U.S. Pat. No. 5,793,094 to Sanchez et al. discloses the use of an amorphous silicon anti-fuse element which functions by diffusion of metal into the anti-fuse material from the underlying or overlying BEOL metal wire. The '094 patent states that a low programming voltage is obtained. Upon application of a potential difference between the two metal layers, metal atoms are driven into the amorphous silicon rendering it highly conductive.

U.S. Pat. No. 5,434,432 to Spratt et al. provides an anti-fuse device that includes an anti-fuse material that is separated by a first conductor and a second conductor. The anti-fuse material includes a dopant which raises the band gap and seals off paths in grain boundaries of the anti-fuse material in order to limit leakage current from flowing between the first conductor and the second conductor. When an interconnection is desired, a high voltage pulse is applied across the first conductor and the second conductor to initially break down the anti-fuse material. The breakdown of the anti-fuse material causes a filament to form between the first conductor and the second conductor. The filament creates a conduction path connecting the first conductor and the second conductor electrically together. Additional current is forced through the anti-fuse material to permanently set the filament in order to interconnect circuit elements coupled to the first conductor and the second conductor. This prior art modifies the conductive properties of a semiconducting material and also suffers from the requirement of high programming voltages. Moreover, the anti-fuse disclosed in Spratt et al. requires a special anti-fuse material, which departs from normal semiconductor processing.

U.S. Pat. No. 5,903,041 to La Fleur et al. combines a fuse and an anti-fuse in a single structure. The fuse assists in lowering the resistance of a weakly enabled anti-fuse. After the anti-fuse is fully enabled, the fuse itself is blown and removed from the circuit. The '041 patent provides a two-terminal (between conductors) fuse-anti-fuse structure comprising a vertical anti-fuse portion and a horizontal fuseable link portion. A high voltage is applied across the two terminals to first break down the insulator and program the anti-fuse. Upon shorting the anti-fuse, a relatively high current through the path provided by the programmed anti-fuse then blows the fuseable link. Prior to blowing the fuseable link, the common current through the anti-fuse and fuseable link lowers the resistance of the programmed anti-fuse. An improvement permitting higher current programming of the fuseable link incorporates air gaps which provide pockets of space either above, below or both above and below the fuseable link portion of the device. The air gaps provide a place for material disrupted (melted or vaporized) by the fuseable link. This prior art structure requires a relatively high voltage to program the anti-fuse because the programming mechanism seeks to pass a programming current directly through the anti-fuse material.

In view of the above, a structure including at least one fuse element and at least one anti-fuse element and method of fabrication the same which addresses the above-mentioned concerns and limitations of prior art fuse/anti-fuse structures are needed.

SUMMARY OF THE INVENTION

This invention relates to a semiconductor structure including at least one fuse element and at least one anti-fuse element that are embedded with a dielectric material of an interconnect structure, and a method of fabricating such a structure, which solve the above-mentioned problems of the prior art. Specifically, the present invention provides a structure including an anti-fuse element that can be programmed with ordinary on-chip or readily available voltages. Thus the need for support circuitry for generating and steering the relatively high voltages is eliminated. Moreover, the inventive structure allows programming of the anti-fuse element at normally available internal or external voltages, and is inexpensively integrated into contemporary semiconductor processes. The present invention also provides a method of fabrication, which is easily and economically integrated with standard semiconductor processing.

In the inventive structure disclosed herein, programming of the anti-fuse element is achieved by an electromigration induced hillock adjacent to a first conducting line. Such programming is not disclosed in any prior art known to the applicants. The hillock breaches a thin barrier layer on the sidewall of the first conducting line, which leads to diffusion of metal atoms from the metal line into the adjacent dielectric material. The presence of the localized metallic contamination in the dielectric results in a leakage current between two additional adjacent conductors, a second and third conducting line. Conduction between two lines may occur by bridging through the first conductor, or by direct conduction between second and third lines, if they are located on the same side of the first conductor. Enablement of the anti-fuse may optionally include opening of the first conductive line.

It is well known, and it has been experimentally observed, that voiding due to electromigration occurs at the cathode end of a fuse, where the divergence of the current density is positive. Also, hillock formation has been observed at the anode end of a fuse, where the divergence of the current density is negative. If the diffusion barrier liner that is standard for BEOL metal damascene lines contains a defect at the location of hillock formation, the hillock may breach the liner. This causes metallic contamination to enter the adjacent dielectric material, which results in leakage currents between adjacent lines through the dielectric.

In general terms, the present invention provides a semiconductor structure that comprises:

an interconnect dielectric material;

at least one fuse element embedded within said interconnect dielectric material, said at least one fuse element comprises a conductive material located within a line opening which includes a first diffusion barrier having a first thickness located on sidewalls and a bottom wall of said line opening; and at least one anti-fuse element embedded with said interconnect dielectric material, said at least one anti-fuse element comprises said conductive material located within a combined via and line opening which includes said first diffusion barrier having said first thickness located on sidewalls and a bottom wall of said combined via and line opening and a second diffusion barrier having a second thickness located on said first diffusion barrier, wherein said second thickness is greater than the first.

In the inventive structure, the at least one anti-fuse element has an upper surface that is coplanar with an upper surface of the at least one anti-fuse element. In some embodiments of the present invention, a single fuse element is surrounded by anti-fuse elements that are located within combined via and line openings. In still further embodiments of the present invention, the second diffusion barrier having the second thickness is also located within the line opening housing the fuse element. When the second diffusion barrier is present within the fuse element, it is located only on a horizontal surface of the first diffusion barrier. The presence of second diffusion barrier within the fuse element is optional.

In addition to the semiconductor structure described above, which represents a structure prior to blowing the fuse element, the present invention also provides a semiconductor structure that is formed after blowing the fuse element. In general terms, this structure of the present invention comprises:

an interconnect dielectric material;

at least one ruptured fuse element embedded within said interconnect dielectric material, said at least one ruptured fuse element comprises a conductive material located within a line opening which includes a first diffusion barrier having a first thickness located on a bottom wall of said line opening; and at least one anti-fuse element embedded with said interconnect dielectric material, said at least one anti-fuse element comprises said conductive material located within a combined via and line opening which includes said first diffusion barrier having said first thickness located on sidewalls and a bottom wall of said combined via and line opening and a second diffusion barrier having a second thickness this is greater than the first thickness located on said first diffusion barrier.

In the second inventive structure, the at least one anti-fuse element has an upper surface that is coplanar with an upper surface of the at least one anti-fuse element. In some embodiments of the second structure, a single fuse element is surrounded by anti-fuse elements that are located within combined via and line openings. In still further embodiments of the second structure, the second diffusion barrier having the second thickness is also located within the line opening housing the fuse element. When the second diffusion barrier is present within the fuse element, it is located only on a horizontal surface of the first diffusion barrier. The presence of second diffusion barrier within the fuse element is optional.

In addition to the semiconductor structures described above, the present invention also provides a method of fabricating the same.

The method of the present invention comprises:
forming at least one line opening and at least one combined via and line opening in an interconnect dielectric material;
forming a first diffusion barrier layer having a first thickness within at least both of said openings;
protecting the first diffusion barrier layer located within said at least one line opening;
forming a second diffusion barrier layer at least within said at least one combined via and line opening;
unprotecting the at least one line opening; and
forming a conductive material within said openings, wherein at least one fuse element is formed within said at least one line opening and at least one anti-fuse element is formed within said at least one combined via and line opening.

In some embodiment of the present invention a third diffusion barrier layer having a third thickness that is greater than the first thickness is formed on at least exposed horizontal surfaces within said at least one line opening. This optional step occurs between the steps of unprotecting and forming the conductive material.

BRIEF DESCRIPTION OF THE DRAWINGS

FIG. 1 is a pictorial representation (through a cross sectional view) illustrating a prior art anti-fuse structure, which includes a metal-1 layer 14, an anti-fuse layer 16, and an interconnect layer 22 embedded in a dielectric layer 18.

FIG. 2 is pictorial representation illustrating both top-view and cross-section of a two-dimensional dog-bone shape fuse element of the prior art having a small cross-sectional area between large cathode and anode pads.

FIGS. 3A-3C are pictorial representations (through different views) illustrating the inventive fuse/anti-fuse structure. FIG. 3A is a top-down view of the inventive structure, FIG. 3B is a cross sectional view through cut A-A shown in FIG. 3A, and FIG. 3C is a cross sectional view through cut B-B shown in FIG. 3A.

DETAILED DESCRIPTION OF THE INVENTION

The present invention, which provides a fuse/anti-fuse structure as well as a method of fabricating the same, will now be described in greater detail by referring the following discussion and drawings that accompany the present application. It is noted that the drawings of the present application are provided for illustrative purposes only, and thus the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a fuse/anti-fuse structure that can be programmed with ordinary on-chip or readily available voltages. Thus the need for support circuitry for generating and steering the relatively high voltages is eliminated. Moreover, the inventive anti-fuse allows programming at normally available internal or external voltages, and is inexpensively integrated into contemporary semiconductor processes. The present invention also provides a method of fabrication which is easily and economically integrated with standard semiconductor processing.

Figure 3B:
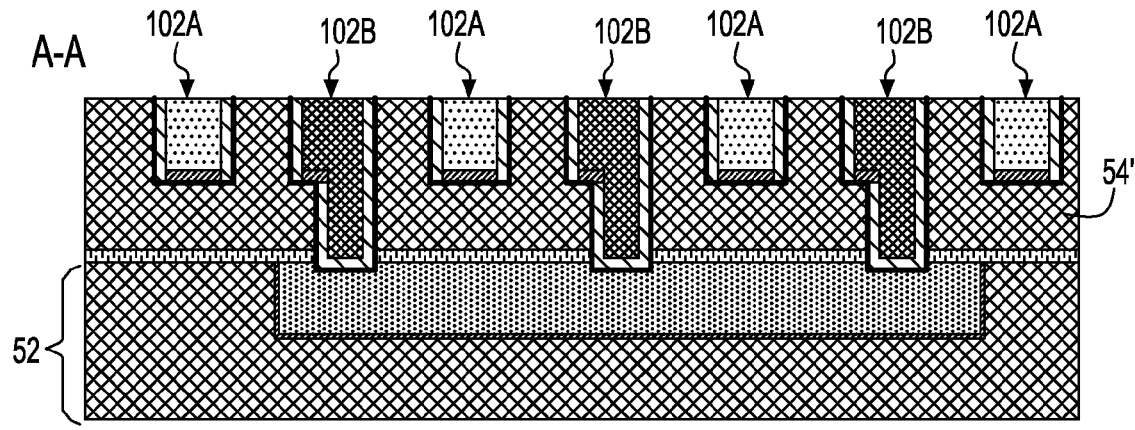
Figure 3C:
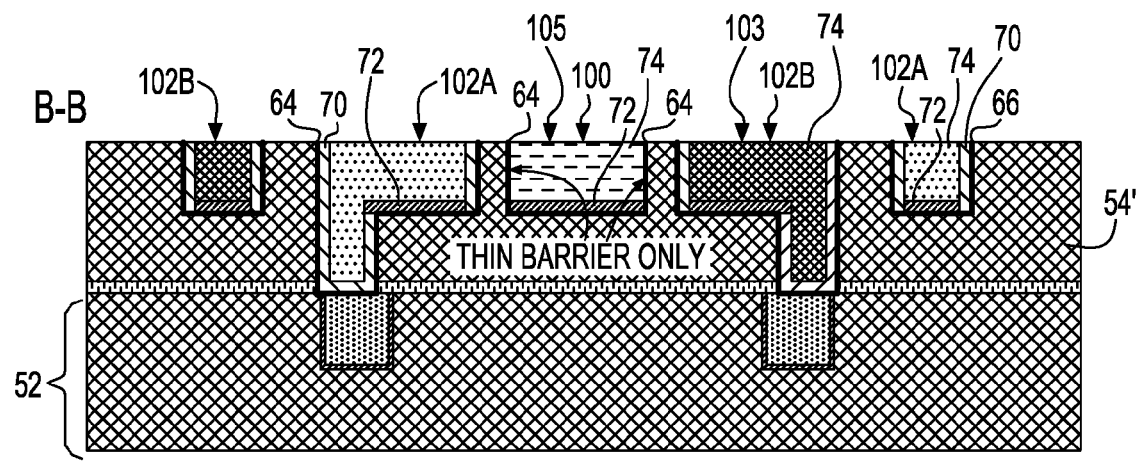

Reference is first made to FIGS. 3A-3C which are pictorial representations (through different views) illustrating the inventive fuse/anti-fuse structure. FIG. 3A is a top-down view of the inventive structure, FIG. 3B is a cross sectional view through cut A-A shown in FIG. 3A, and FIG. 3C is a cross sectional view through cut B-B shown in FIG. 3A. The inventive structure as shown in FIG. 3A comprises a central first conductive line that serves as a fuse element 100 surrounded by alternating fingers of a second conductor (anti-fuse element 102A) and a third conductor (anti-fuse element 102B). The conductors are surrounded by a dielectric material 54' as shown in FIGS. 3B and 3C.

Figure 4:
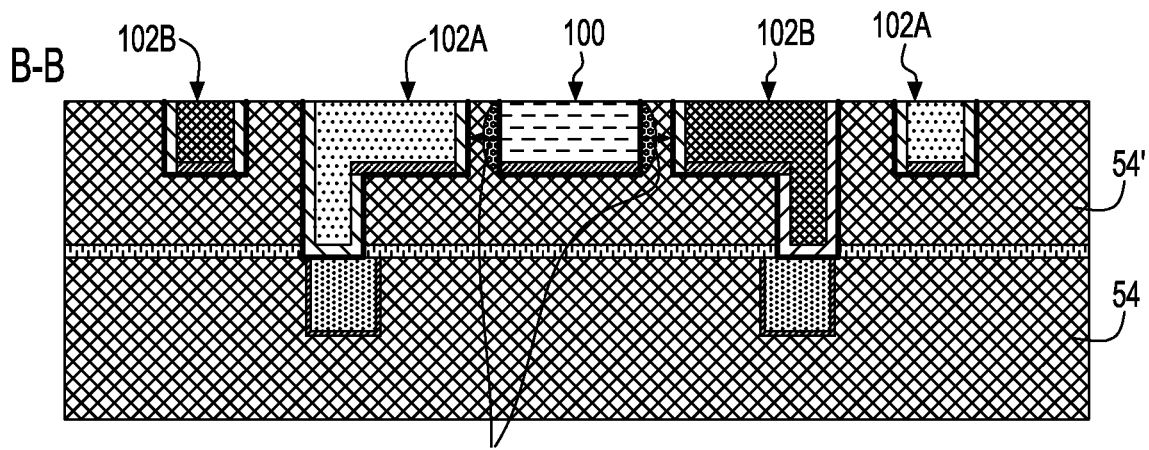
FIG. 4 is a pictorial representation (through cut B-B shown in FIG. 4A) after the fuse element metal diffuses into the dielectric through a breached sidewall barrier.

The inventive structure is better understood by referring to the cross-sectional cut views A-A and B-B shown in FIGS. 3B and 3C, respectively. Cross-section A-A, which cuts transversely through the anti-fuse elements, shows the anti-fuse elements 102A and 102B interconnected to a lower wiring level 52. The anti-fuse elements, 102A and 102B are combined with both via and line openings. Note that cross-section B-B, which cuts transversely through the fuse element 100, shows that only a thin diffusion barrier layer 64 exists on the sidewalls of the fuse element 100. All the other surfaces of the conductors are lined with a thicker barrier (70, 72) which effectively prevents the metal from diffusing into the dielectric material 54'. In FIG. 3A, the electron flux from cathode to anode in the fuse conductor results in the formation of hillocks near the anode end of the line. The hillocks rupture the thin barrier on the sidewalls of the fuse, allowing metal to diffuse into the surrounding dielectric material 54'. The metal that diffuses into the dielectric material 54' causes electrical leakage between anti-fuse elements 102A and 102B (FIG. 4). The leakage current is then used to control an electronic switch.

More specifically, the structure shown in FIGS. 3A-3C includes an interconnect dielectric material 54' and at least one fuse element 100 embedded within the interconnect dielectric material 54'. The at least one fuse element 100 (which may also be referred to as a conductive line) comprises a conductive material 74 located within a line opening which includes a first diffusion barrier 64 having a first thickness located on sidewalls and a bottom wall of the line opening 62 and an optional second diffusion barrier 72 having a second thickness located on the first diffusion barrier 64 that is located directly on said bottom wall, said second thickness is greater than the first thickness. The structure further includes at least one anti-fuse element (102A and 102B) embedded with the interconnect dielectric material 54'. The at least one anti-fuse element (102A and 102B) comprises the conductive material 74 located within a combined via and line opening which includes the first diffusion barrier 64 having said first thickness located on sidewalls and a bottom wall of the combined via and line opening and said second diffusion barrier (now represented by diffusion barrier layers 70 and 72) having a second thickness located on said first diffusion barrier 64. It is noted that in some embodiments the second diffusion barrier of the inventive structure is a continuous diffusion barrier layer that includes two thick diffusion barrier layers that horizontally abut each other so that no seams or gaps are present. The two thick diffusion barrier layers have the same or nearly the same thickness.

In the inventive structure, the at least one anti-fuse element (102A and 102B) has an upper surface 103 that is coplanar with an upper surface 105 of the at least one fuse element (100). In some embodiments as shown, a single fuse element is surrounded by anti-fuse elements that are located within combined via and line openings.

FIG. 4 is a pictorial representation (a sectional view through cut B-B shown in FIG. 3A) after the fuse element metal diffuses into the dielectric through a breached sidewall barrier.

Figure 5A:
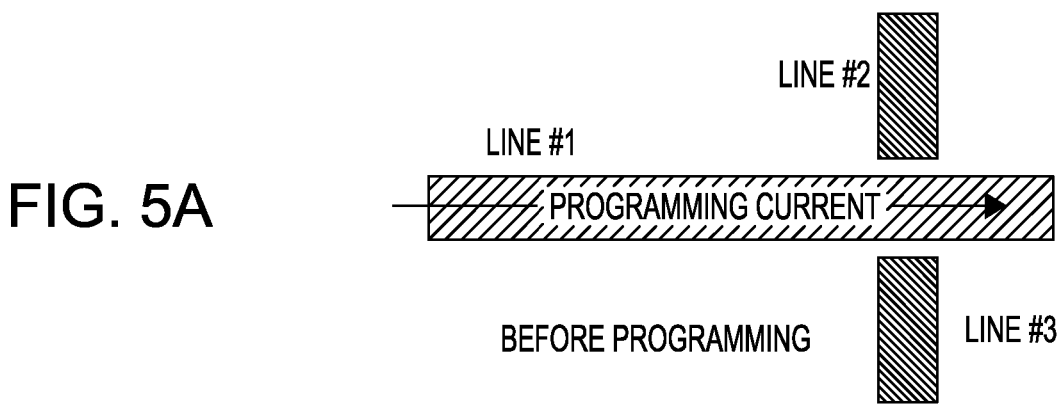
FIGS. 5A-5B are schematic illustrations of the inventive programming mechanism.
Figure 5B:
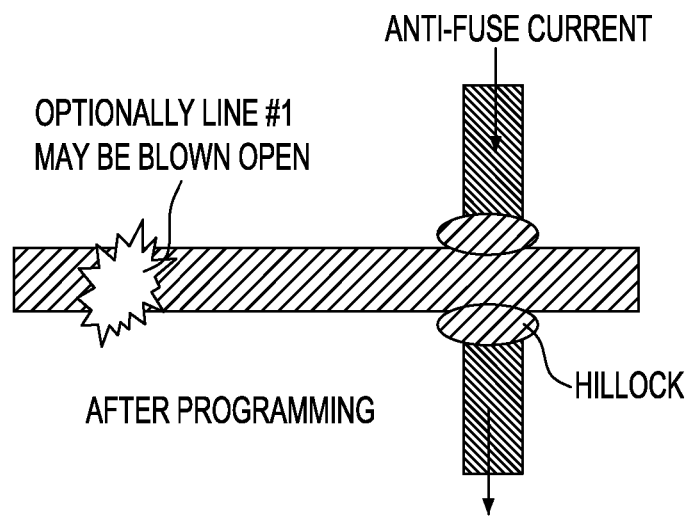

The inventive anti-fuse disclosed herein is novel from all known prior art in that programming is achieved by an electromigration induced hillock adjacent to a first conducting line (e.g., fuse element 100). The hillock breaches a thin barrier layer 64 on the sidewall of the first conducting line, which leads to diffusion of metal atoms from the metal line into the adjacent dielectric material 54'. The presence of the localized metallic contamination in the dielectric material 54' results in a leakage current between two additional adjacent conductors, a second and third conducting line, e.g., anti-fuse structures 102A and 102B. Conduction between lines 2 and 3 may occur by bridging through the first conductor, or by direct conduction between second and third lines, if they are located on the same side of the first conductor. The mechanism is schematically illustrated by FIGS. 5A-5B. Enablement of the anti-fuse may optionally include opening of the first conductive line.

A detailed description of the method of fabricating the inventive anti-fuse structure is now presented herein below. The structure at various intermediate stages of fabrication is shown in FIGS. 6A-6I with respect to cross-section B-B.

Figure 6A:
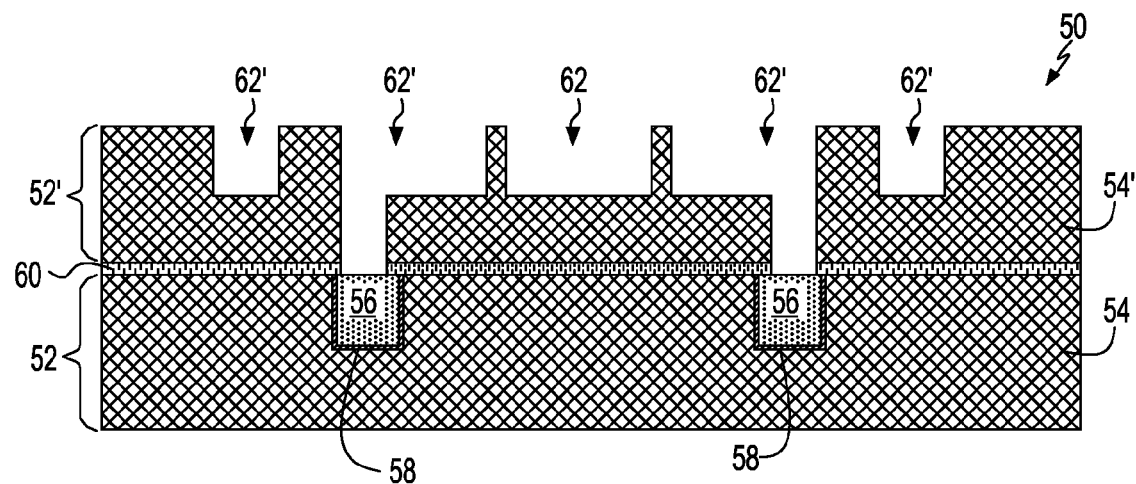
FIGS. 6A-6I are pictorial representations (through cross sectional views) illustrating the basic processing steps of the present invention for fabricating the inventive anti-fuse structure.

The process flow of the present invention begins with providing the initial interconnect structure 50 shown in FIG. 6A. Specifically, the initial interconnect structure 50 shown in FIG. 6A comprises a multilevel interconnect including a lower interconnect level 52 and an upper interconnect level 52' that are separated in part by a dielectric capping layer 60. The lower interconnect level 52, which may be located above a semiconductor substrate (not shown) including one or more semiconductor devices, comprises a first dielectric material 54 having at least one conductive feature (i.e., a conductive region; the terms "conductive region" and "conductive feature" are used interchangeably throughout the present application) including a conductive material 56 that is separated from the first dielectric layer 54 by a barrier layer 58. The upper interconnect level 52' comprises a second dielectric material 54' that has a plurality of openings located therein; these opening will be subsequently described in greater detail.

The initial structure 50 shown in FIG. 6A is made utilizing conventional techniques well known to those skilled in the art. For example, the initial interconnect structure 50 can be formed by first applying the first dielectric material 54 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 54 of the lower interconnect level 52 may comprise any interlevel or intralevel dielectric including inorganic dielectrics or organic dielectrics. The dielectric constant of the first dielectric material 54 is about 4.0 or less. The first dielectric material 54 may be porous or non-porous, with porous dielectrics having a dielectric constant of about 2.8 or less being highly preferred in some embodiments of the present invention. Some examples of suitable dielectrics that can be used as the first dielectric material 54 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Any conventional deposition process including, but not limited to CVD, PECVD and spin-on coating, may be used to form the first dielectric material 54.

As stated above, the first dielectric material 54 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 54 may vary depending upon the dielectric material used as well as the exact number of dielectrics within the lower interconnect level 52. Typically, and for normal interconnect structures, the first dielectric material 54 has a thickness from about 200 to about 450 nm.

The lower interconnect level 52 also has at least one conductive feature that is embedded in (i.e., located within) the first dielectric material 54. The conductive feature comprises a conductive material 56 that is separated from the first dielectric material 54 by a barrier layer 58. The conductive feature is formed by lithography (i.e., applying a photo resist to the surface of the first dielectric material 54, exposing the photo resist to a desired pattern of radiation, and developing the exposed resist utilizing a conventional resist developer), etching (dry etching or wet etching) an opening in the first dielectric material 54 and filling the etched region with the barrier layer 58 and then with a conductive material 56 forming the conductive feature.

The barrier layer 58, which may comprise, for example, Ta, Tan, Ti, Tin, Ru, Run, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, and plating.

The thickness of the barrier layer 58 may vary depending on the exact means of the deposition process as well as the material employed. Typically, the barrier layer 58 has a thickness from about 4 to about 40 nm, with a thickness from about 7 to about 20 nm being more typical.

Following the barrier layer 58 formation, the remaining region of the opening within the first dielectric material 54 is filled with a conductive material 56 forming the conductive feature. The conductive material 56 used in forming the conductive feature includes, for example, polySi, a conductive metal, an alloy comprising at least one conductive metal, a conductive metal silicide or combinations thereof. Preferably, the conductive material 56 that is used in forming the conductive feature is a conductive metal such as Cu, W or Al, with Cu or a Cu alloy (such as Alco) being highly preferred in the present invention. The conductive material 56 is filled into the remaining opening in the first dielectric material 54 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer and the conductive feature each have an upper surface that is substantially coplanar with the upper surface of the first dielectric material 54.

After forming the at least one conductive feature, a blanket dielectric capping layer 60 is formed on the surface of the lower interconnect level 52 utilizing a conventional deposition process such as, for example, CVD, PECVD, chemical solution deposition, or evaporation. The dielectric capping layer 60 comprises any suitable dielectric capping material such as, for example, SiC, Sighed 4NH$_3$, SiO$_2$, a carbon doped oxide, a nitrogen and hydrogen doped silicon carbide SiC(N,H) or multilayers thereof. The thickness of the capping layer 60 may vary depending on the technique used to form the same as well as the material make-up of the layer. Typically, the capping layer 60 has a thickness from about 15 to about 55 nm, with a thickness from about 25 to about 45 nm being more typical.

Next, the upper interconnect level 52' is formed by applying the second dielectric material 54' to the upper exposed surface of the capping layer 60. The second dielectric material 54' may comprise the same or different, preferably the same, dielectric material as that of the first dielectric material 54 of the lower interconnect level 52. The processing techniques and thickness ranges for the first dielectric material 54 are also applicable here for the second dielectric material 54'. The second dielectric material 54' can also comprise two different materials, i.e., deposition of one dielectric material first, followed by deposition of a different dielectric material. In one embodiment of the present invention, the second dielectric material 54 comprises two different low k dielectric materials and thus the upper interconnect level 54' has a hybrid structure.

As stated above, the initial structure 50 shown in FIG. 6A also includes a plurality of openings which are present in the second dielectric material 54'. The plurality of openings include at least one line opening 62 and at least one combined via and line opening 62' can be formed. When a combined via and line opening 62' is formed, a first via and then a line opening process may be used, or a first line and then a via process may be used. The at least combined via and line opening 62' is used in the present invention as an area for forming an anti-fuse element. The at least one line opening 62 is an area used in forming the fuse element of the inventive structure. The plurality of openings are formed by lithography and etching. In the regions including a combined via and line opening 62', at least a portion of the upper surface of the conductive material 56 of the lower interconnect level 52 is exposed.

Figure 6B:
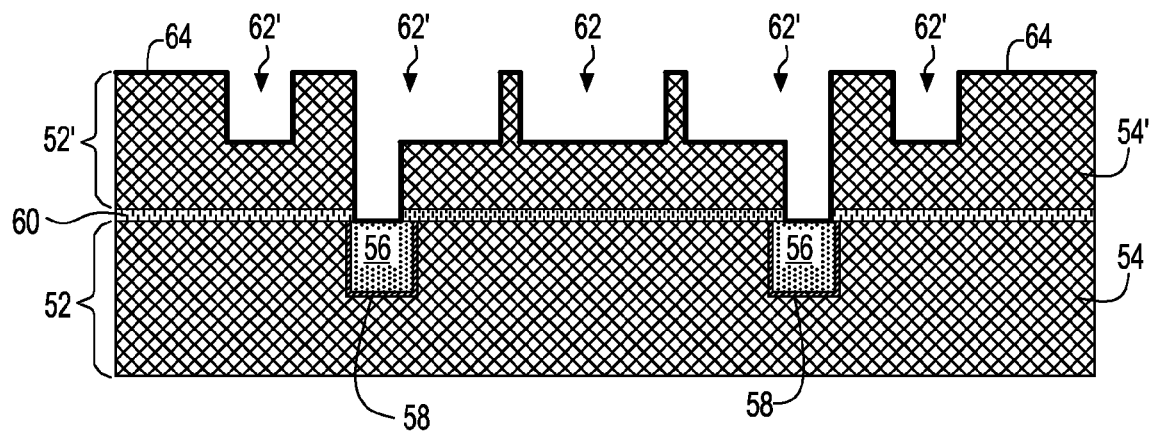

A thin diffusion barrier layer (i.e., first diffusion barrier) 64 is then conformally formed on all exposed surfaces of the structure shown in FIG. 6A providing the structure shown, for example, in FIG. 6B. The term "thin" as used in connection with diffusion barrier layer 64, denotes a thickness that is less than about 20 nm. More preferably, the thin diffusion barrier layer 64 has a thickness from about 1 to about 10 nm.

The thin diffusion barrier layer 64 comprises at least one of Ta, Ti, Ru, W, Ir and any other material that can serve as a barrier to prevent conductive material from diffusing there through. Alloys of the above metals, with or without an alloying element, are also contemplated in the present invention. Examples of alloying elements include, but are not limited to one of O, S, N and P. The thin diffusion barrier layer 64 is formed by a conventional deposition process which provides good step coverage including, for example, CVD, PECVD, atomic layer deposition (ALD), physical vapor deposition (PVD), sputtering, chemical solution deposition and plating.

Figure 6C:
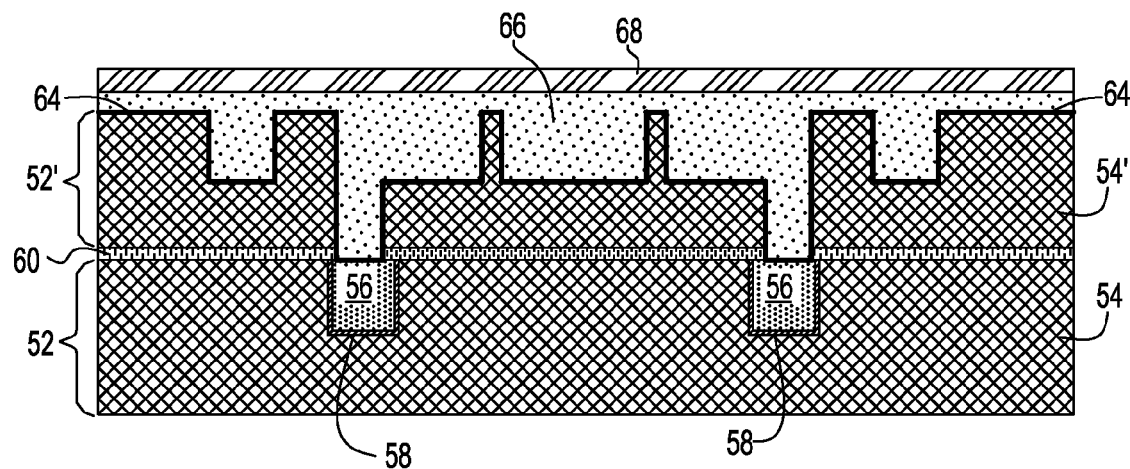

Reference is now made to FIG. 6C which illustrates the structure after formation of an organic planarizing material 66, and an oxide layer 68. As illustrated in FIG. 6C, the organic planarizing material 66 is formed prior to formation of the oxide layer 68. The organic planarizing material 66 includes a polyimide, a photoresist or combinations thereof. Typically, the organic planarizing material 66 is a polyimide. The organic planarizing material 66 is typically, but not necessarily always, formed by a spin-on deposition process. The thickness of the organic planarizing material 66 may vary and is not critical to the present invention so long as the organic planarizing material 66 fills the plurality of openings and extends above the uppermost surfaces of the structure shown in FIG. 6B. Note that the organic planarizing material 66 is formed directly atop the thin diffusion barrier layer 64.

Oxide layer 68 is then formed on an upper exposed surface of the organic planarizing material 66. The oxide layer 68 may be formed by any deposition process including for example, CVD and PECVD. Although the thickness of the oxide layer 68 that is formed may vary, the oxide layer 68 typically has a thickness that is from about 20 to about 100 nm.

Figure 6D:
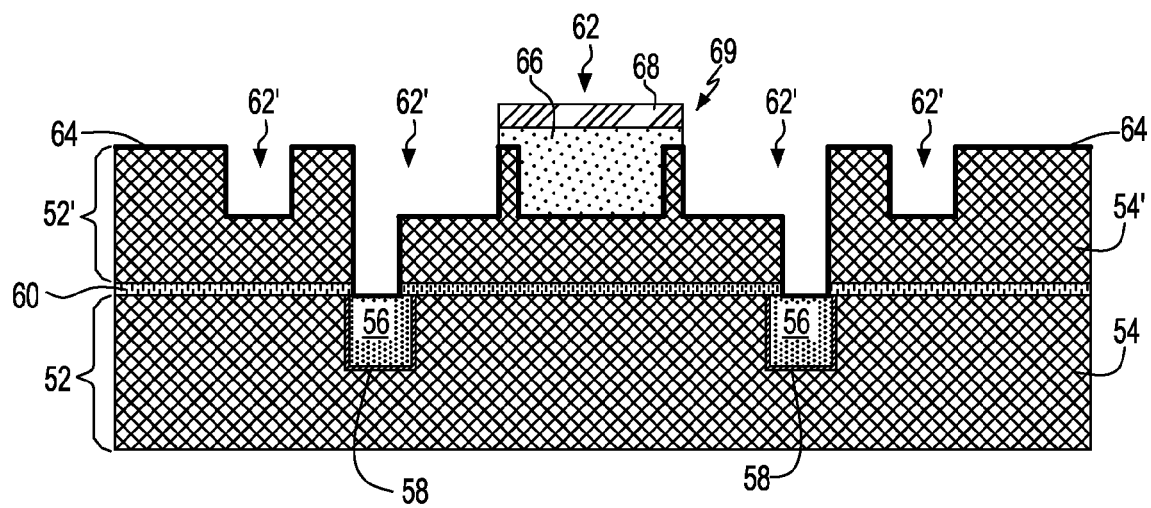

Next, and as illustrated in FIG. 6D, the oxide layer 68 is patterned by lithography and etching so as to remove the oxide layer 68 from everywhere except for the one line opening 62 that will be used in forming the fuse element of the inventive structure. After this removal step, the exposed portions of the organic planarizing material 66 are etched down to the thin diffusion barrier layer 64 (see FIG. 6D as well). Typically, either a reactive ion etching process containing $O_2$, $H_2$, $N_2$, or $NH_3$, or a wet etching process containing an aqueous alkali based solution is used to remove the exposed portions of the organic planar zing material 66 from the structure. It is emphasized that the area in which the fuse element will be subsequently formed, i.e., line opening 62, is protected by a patterned material stack 69 including the remaining oxide layer 68 and the underlying organic planar zing material 66; the other areas (openings 62') in which anti-fuse elements are to be subsequently formed are left unprotected.

Figure 6E:
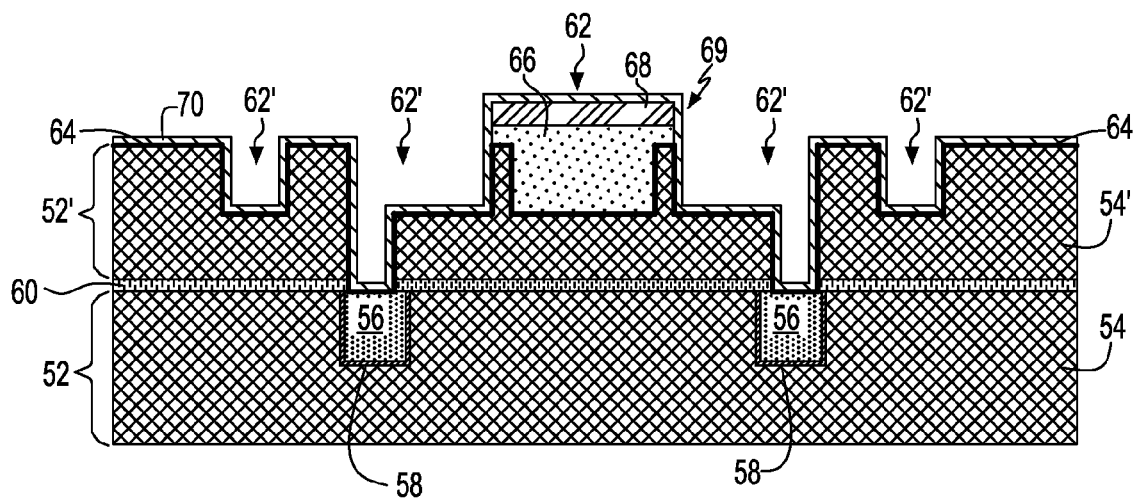

A thick diffusion barrier layer 70 is then formed on the structure shown in FIG. 6D providing the resultant structure shown in FIG. 6E. The thick diffusion barrier layer 70 may include the same or different diffusion barrier material as the thin diffusion barrier layer 64. As is illustrated, the thick diffusion barrier layer 70 lines the exposed portions of the openings that are not protected by patterned material stack 69 described above. Specifically, the thick diffusion barrier layer 70 is present in the openings 62' that will subsequently be used as areas for forming the anti-fuse elements of the present invention. The thick diffusion barrier 70 can be formed utilizing the same or different deposition process which was used in forming the thin diffusion barrier layer 64. The thick diffusion barrier layer 70 has a thickness that is greater than that of the thin diffusion barrier. Typically, the thickness of the thick diffusion barrier is greater than 30 nm with a range from about 35 to about 50 nm being preferred.

Next, a layer of planarizing photoresist (not shown) is applied to the structure shown in FIG. 6E and recessed by etching to expose the horizontal surfaces of the thick diffusion barrier layer 70 everywhere, except for the bottom of the vias which are located atop the conductive material 56 of the first interconnect level 52. With the recessed resist protecting the remaining thick diffusion barrier layer 70 at the bottom of the vias, the thick diffusion barrier layer 70 is etched selective to the thin diffusion barrier 64, from the exposed horizontal surfaces. Note that the thin diffusion barrier layer 64 remains in the regions in which the anti-fuse elements will be subsequently formed. The remaining oxide layer 68 and organic planarizing material 66 are removed by stripping providing the structure shown in FIG. 6F.

Figure 6F:
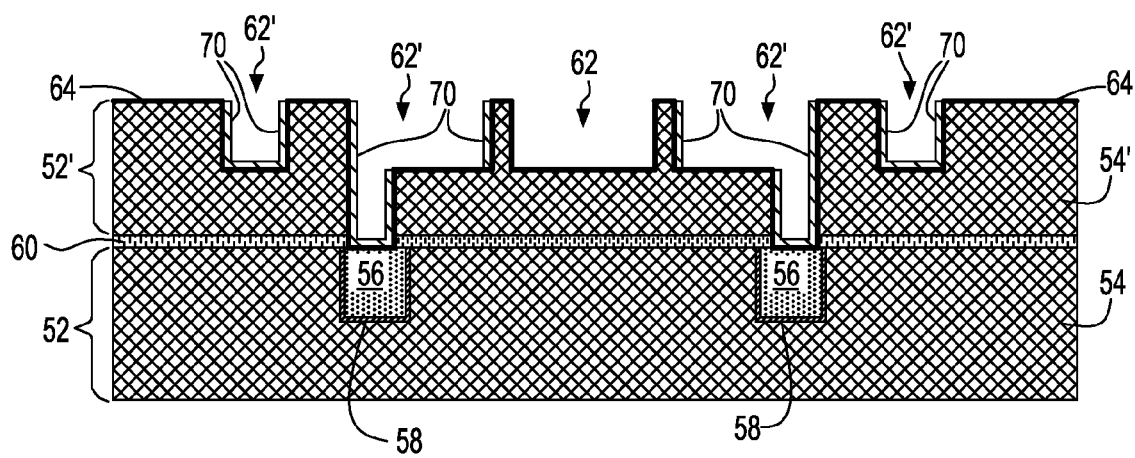

It should be noted that in the structure shown in FIG. 6F, the thick diffusion barrier layer is absent from the line opening 62, yet present on the vertical wall portions within openings 62'. Each of the various areas (i.e., openings 62 and 62') include the thin diffusion barrier layer 64.

In addition to the approach described above, a high angle gaseous, for example Ar, He, Xe, bombardment process may be used to physically remove the thick diffusion barrier layer 70 from the openings 62', but not from the via bottoms. Following such a gaseous bombardment process the remaining oxide layer 68 and the organic planarizing material 66 that protected the line opening 62 is removed.

Figure 6G:
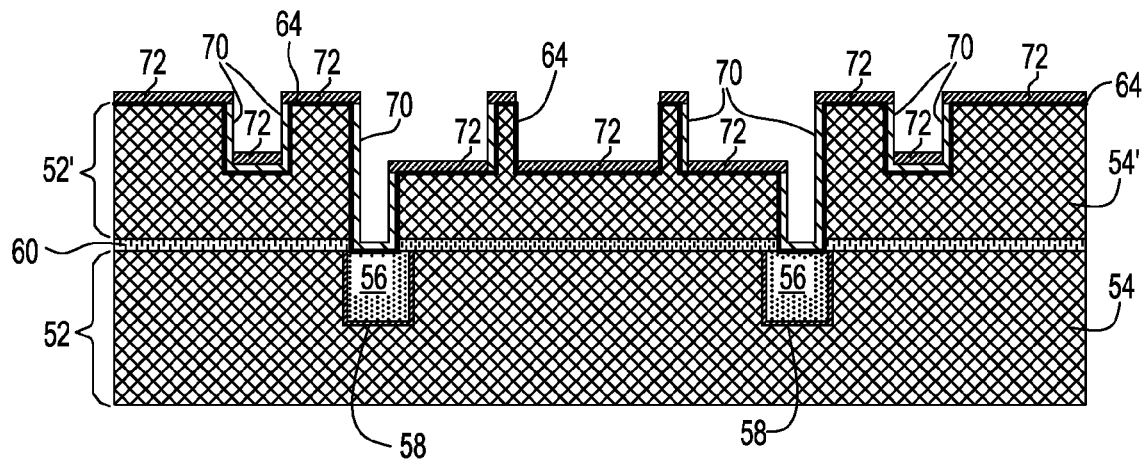

At this point of the present invention, another thick diffusion barrier layer 72 is directly deposited using a directional PVD technique. Note that the thick diffusion barrier layer 70 and this other thick diffusion barrier layer 72 form a continuous thick diffusion barrier within the structure. This continuous thick diffusion barrier referred to herein as the second diffusion barrier of the inventive structure. The directional deposition covers only the horizontal surfaces. The resultant structure that is formed after the directional deposition process has been performed is illustrated in FIG. 6G. Diffusion barrier layer 72 has same or substantially thickness the same as the thick diffusion barrier layer 70. Additionally, the other thick diffusion barrier layer 72 may be comprised of the same or different diffusion barrier material as the first thick diffusion barrier layer 70.

Figure 6H:
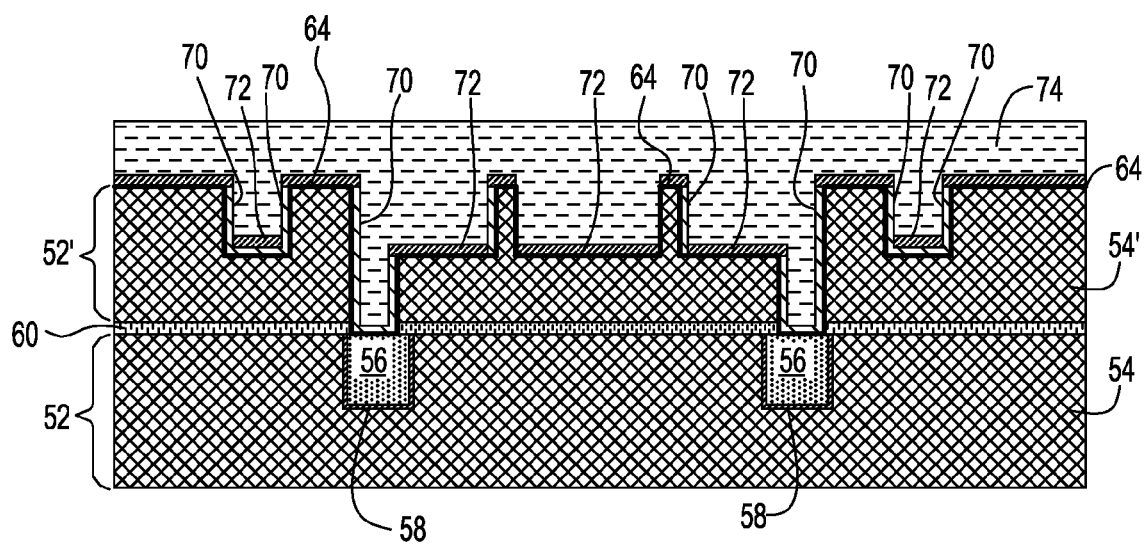

A conductive material 74 used in forming a conductive feature embedded within the second dielectric material 54' is then formed providing the structure shown, for example, in FIG. 6H. The conductive material 74 includes, for example, polySi, a conductive metal, an alloy comprising at least one conductive metal, a conductive metal silicide or combinations thereof. Preferably, the conductive material 74 is a conductive metal such as Cu, W or Al, with Cu or a Cu alloy (such as AlCu) being highly preferred in the present invention. The conductive material 74 is filled into openings in the second dielectric material 54 utilizing a conventional deposition process including, but not limited to: CVD, PECVD, sputtering, chemical solution deposition or plating. When plating is used, a plating seed layer such as Cu, Al or AlCu is formed prior to the deposition process.

Figure 6I:
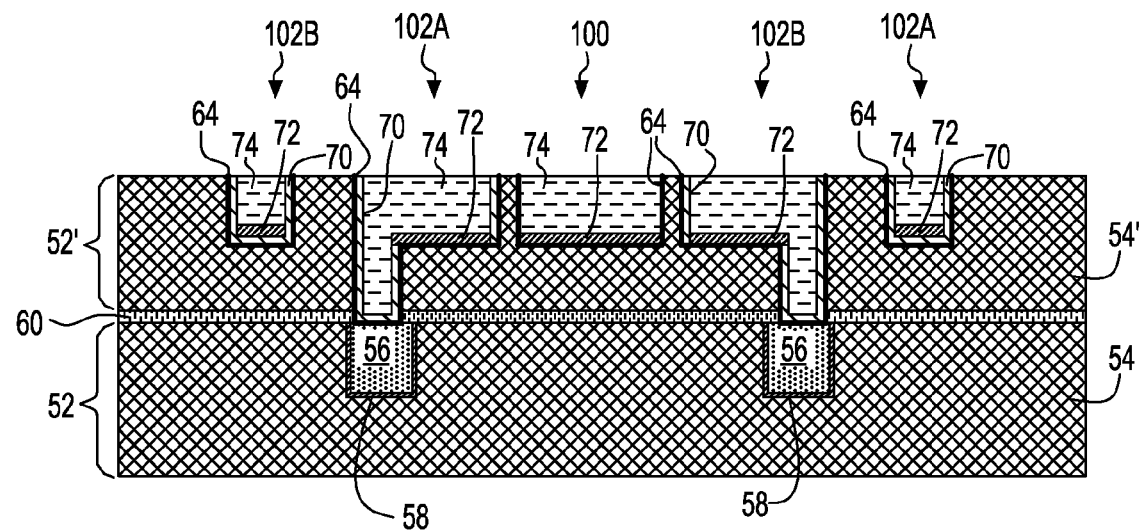

After deposition, a conventional planarization process such as, for example, chemical mechanical polishing (CMP) and/or grinding can be used to provide the planarized structure shown in FIG. 6I. This provides an upper surface that has coplanar features.

Figure 7:
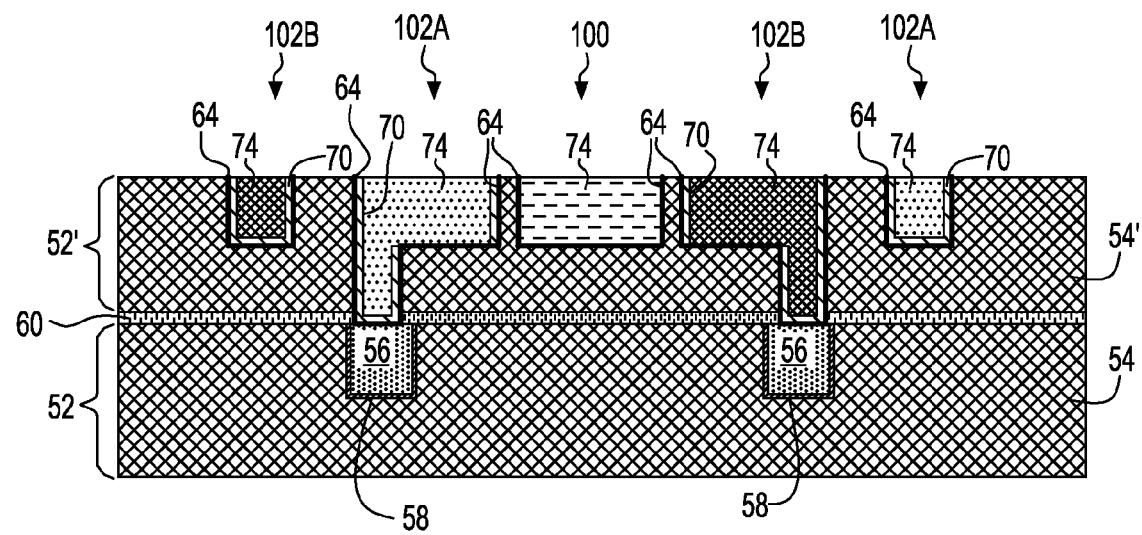
FIG. 7 is a pictorial representation (through a cross sectional view) illustrating another embodiment of the invention in which no thick diffusion barrier is present within the fuse element.

In some embodiments of the present invention, the step of forming the second diffusion barrier layer 72 can be omitted. Such an embodiment typically occurs when no second diffusion barrier is to be formed in the line opening 62. When no second barrier is present in the line opening 62, the gaseous bombardment process mentioned above only removes deposited liner material 70 from the field area, and keeps the liner material 70 inside the 62' features, both vertical and horizontal sidewalls. FIG. 7 is a pictorial representation (through a cross sectional view) illustrating another embodiment of the invention in which no thick diffusion barrier is present within the fuse element.

Additional dielectric materials and wiring layers are then formed utilizing conventional interconnect processing to complete the fabrication of a semiconductor chip. In some embodiments, the processing steps used in forming the fuse elements and anti-fuse elements embedded within one of the additional dielectric materials can be practiced.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

forming at least one line opening and at least one combined via and line opening in an interconnect dielectric material, said at least one combined via and line opening is formed by a via first and then line process;

forming a first diffusion barrier layer having a first thickness within at least both of said openings;

protecting the first diffusion barrier layer located within said at least one line opening, said protecting comprising forming a patterned material stack comprising, from top to bottom, an oxide layer and an organic planarizing material;

forming a second diffusion barrier layer at least within said at least one combined via and line opening, said second diffusion barrier layer having a second thickness that is greater than the first;

unprotecting the at least one line opening; and forming a third diffusion barrier having a third thickness that is greater than the first thickness on at least exposed horizontal surfaces within said at least one line opening, said third diffusion barrier is also formed on exposed horizontal surfaces within said at least one combined via and line opening which horizontal surfaces are provided by an angled gaseous bombardment process and said horizontal surfaces are not with said via, said third diffusion barrier and said second diffusion barrier forming a continuous diffusion barrier within the at least one combined via and line opening which is thicker than the underlying first diffusion barrier layer;

forming a conductive material within said openings, wherein at least one fuse element is formed within said at least one line opening and at least one anti-fuse element is formed within said at least one combined via and line opening, wherein hillocks form in said at least one fuse element during operation and said first diffusion barrier located on said sidewalls of said at least one line opening is ruptured to expose said interconnect dielectric material.

* * * * *